(12) United States Patent
Toyoda et al.

(10) Patent No.: US 9,419,132 B2
(45) Date of Patent: Aug. 16, 2016

(54) SEMICONDUCTOR DEVICE

(71) Applicant: FUJI ELECTRIC CO., LTD., Kawasaki-shi (JP)

(72) Inventors: Yoshiaki Toyoda, Matsumoto (JP); Hideaki Katakura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/682,531

(22) Filed: Apr. 9, 2015

(65) Prior Publication Data
US 2015/0311339 A1 Oct. 29, 2015

(30) Foreign Application Priority Data
Apr. 25, 2014 (JP) .................. 2014-092131

(51) Int. Cl.
| | |
|---|---|
| *H01L 29/76* | (2006.01) |
| *H01L 29/78* | (2006.01) |
| *H01L 29/66* | (2006.01) |
| *H01L 29/08* | (2006.01) |
| *H01L 29/10* | (2006.01) |
| H01L 29/423 | (2006.01) |
| H01L 29/06 | (2006.01) |

(52) U.S. Cl.
CPC ........ *H01L 29/7835* (2013.01); *H01L 29/0847* (2013.01); *H01L 29/1045* (2013.01); *H01L 29/66659* (2013.01); *H01L 29/7838* (2013.01); H01L 29/0653 (2013.01); H01L 29/42368 (2013.01)

(58) Field of Classification Search
CPC ..................... H01L 29/0646; H01L 29/66477; H01L 29/78
USPC ................................... 257/341–349
See application file for complete search history.

(56) References Cited

U.S. PATENT DOCUMENTS 6,242,787 B1 * 6/2001 Nakayama .......... H01L 21/8249
257/335

OTHER PUBLICATIONS

S. Kiuchi et al., "Automotive Smart MOSFETs", Fuji Jihou vol. 76 No. 10, (2003) pp. 606-611.
Y. Toyoda et al., "60V-Class Power IC Technology for an Intelligent Power Switch with an Integrated Trench MOSFET", Proceedings of the 25th International Symposium on Power Semiconductor Devices and ICs (ISPSD), May 2013, pp. 147-150.

* cited by examiner

*Primary Examiner* — Cuong Q Nguyen
(74) *Attorney, Agent, or Firm* — Rabin & Berdo, P.C.

(57) ABSTRACT

A semiconductor device can ensure predetermined current capacity under maintaining breakdown voltage characteristics and can promote size reduction. A first n-type offset-diffusion-region is disposed inside a p-type well region. In the first n-type offset-diffusion-region, a LOCOS film is disposed on the surface layer of a part sandwiched between an $n^+$-type drain region and $n^+$-type source region. In the first n-type offset-diffusion-region, a gate electrode is disposed on the part sandwiched between the LOCOS film and the $n^+$-type source region. In the first n-type offset-diffusion-region, impurity concentration is lower at the part beneath the gate electrode than at the part beneath the LOCOS film. Inside the first n-type offset-diffusion-region, a second $n^-$-type offset-diffusion-region is disposed at apart located toward the $n^+$-type source region through the LOCOS film so as to be separated from the LOCOS film by a distance x.

12 Claims, 15 Drawing Sheets

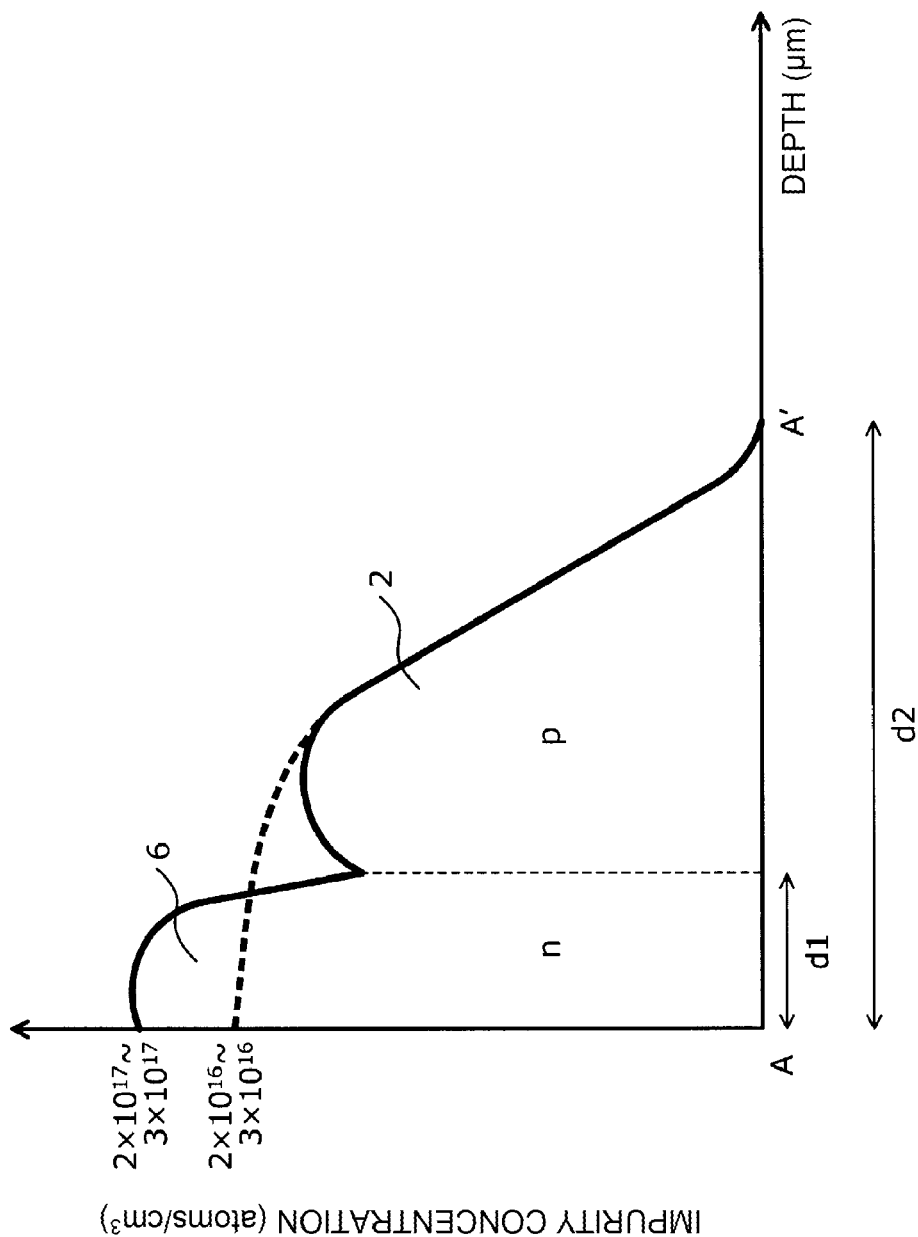

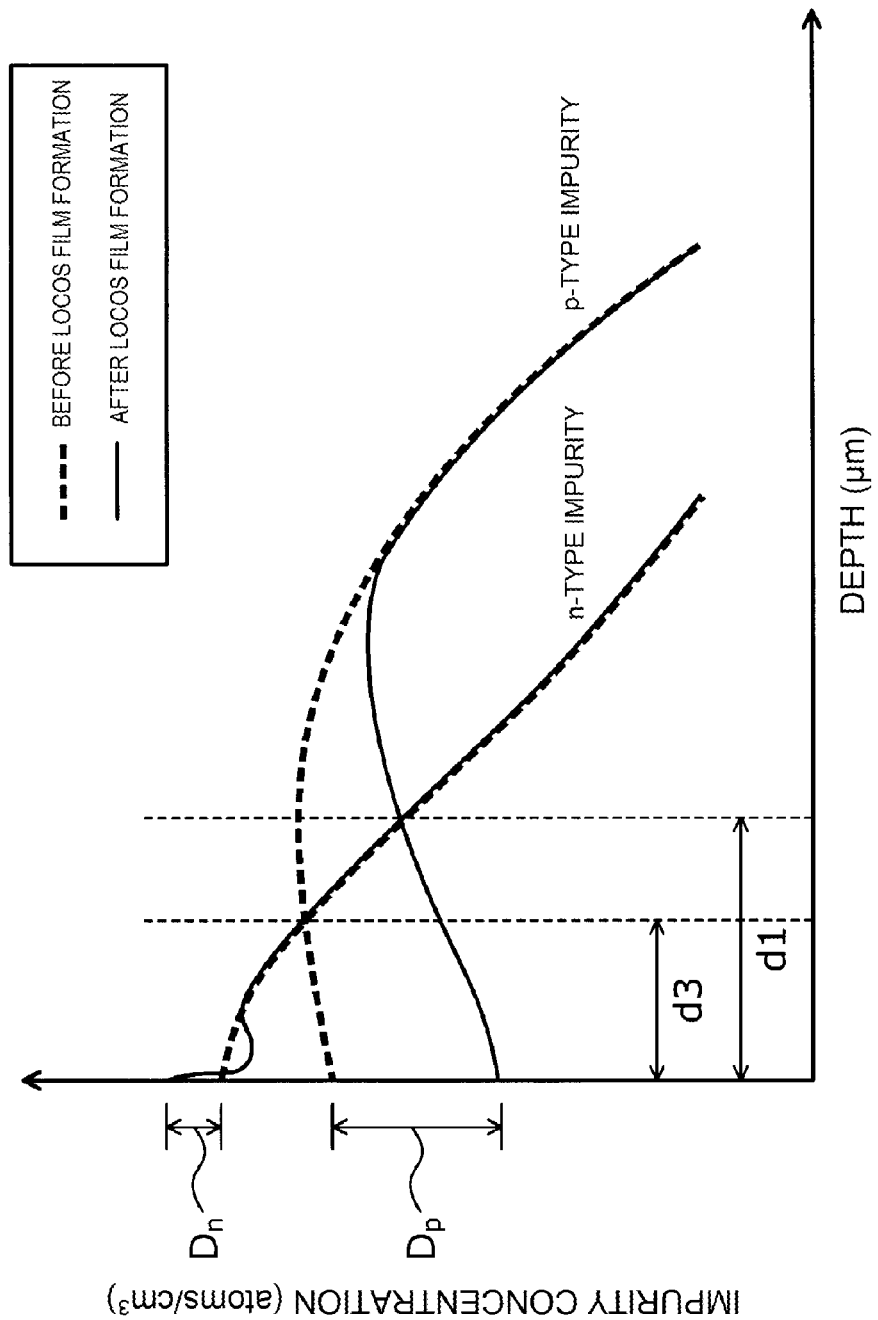

SEMICONDUCTOR DEVICE

CROSS-REFERENCE TO RELATED APPLICATION

This application is based on, and claims priority to, Japanese Patent Application No. 2014-092131, filed on Apr. 25, 2014, the contents of which are entirely incorporated herein by reference.

BACKGROUND OF THE INVENTION

1. Field of the Invention
This invention relates to a semiconductor device.
2. Description of the Related Art
Traditionally, it is known that an insulated gate field effect transistor (metal oxide semiconductor field effect transistor (MOSFET)) is able to realize two operation modes that are an enhancement-type (normally-off type), which is the off-state when a gate voltage is zero volt, and a depletion-type (normally-on type), which is the on-state when the gate voltage is zero volt, depending upon design requirement. In the following, conventional MOSFET structures for both the enhancement-type and the depletion-type will be described.

Initially, on the conventional enhancement-type MOSFET structure, a lateral enhancement-type n-channel MOSFET having middle voltage (for example, approximately 80V) will be described. FIG. 16 is a sectional view illustrating a structure of the conventional enhancement-type MOSFET. In the enhancement-type MOSFET (hereinafter, described as a first conventional example) shown in FIG. 16, a p-type well region 102 is disposed selectively on a surface layer of an n-type semiconductor substrate 101. Each of an $n^+$-type source region 103, a $p^+$-type contact region 104, and an $n^+$-type drain region 105 is disposed selectively inside the p-type well region 102.

Further, inside the p-type well region 102, an n-type offset-diffusion-region 106 is disposed so as to cover the whole surface of an $n^+$-type drain region 105 at the lower side thereof (the inner side of the substrate). An insulation layer 107 composed of an oxide film ($SiO_2$) is disposed at a part sandwiched between the $n^+$-type drain region 105 and the p-type well region 102 on the surface of the n-type offset-diffusion-region 106. A gate electrode 109 is disposed through a gate dielectric film 108 at the part sandwiched between the $n^+$-type source region 103 and the n-type offset-diffusion-region 106 on the surface of the p-type well region 102.

An end portion of the gate electrode 109 extends on the insulation layer 107 at the $n^+$-type drain region 105 side. The $n^+$-type drain region 105 is separated from the gate electrode 109 by the insulation layer 107, and then the distance is enlarged between the $n^+$-type drain region 105 and the gate electrode 109. Then an offset gate structure is configured so that the position of the gate electrode 109 is biased toward the $n^+$-type source region 103. Then the use of the offset gate structure prevents electric field from concentrating at an end portion, which is located at the $n^+$-type drain region 105 side, of the gate electrode 109.

On the other hand, the depletion-type MOSFET, which is the on-state when the gate voltage is zero volt as described above, can apply almost constant drain current (saturation current) between drain and source even when the gate voltage is zero volt. Then it is useful for simplifying circuit configuration such that the depletion-type MOSFET by itself can configure a reference constant current source employed for integrated circuit (IC). Moreover, the depletion-type MOS-FET with middle voltage can be employed for an IC having high power supply voltage, providing a lot of flexibility in circuit design.

A conventional depletion-type MOSFET structure will be described, for example, using a lateral depletion-type n-channel MOSFET with middle voltage. FIG. 17 is a sectional view illustrating a structure of the conventional depletion-type MOSFET. On the depletion-type MOSFET shown in FIG. 17 (hereinafter, described as a second conventional example), the n-type offset-diffusion-region (corresponding to a reference numeral 116 in FIG. 17) extends over almost the whole active region, forming a structure so that the n-type drain region 105 is in contact with the $n^+$-type source region 103 through the n-type offset-diffusion-region 116. This results in configuration of the depletion-type (see, for example, Japanese Non-patent Literature 1: S. Kiuchi et al., "Automotive Smart MOSFETs", Fuji Jihou vol. 76 No. 10, (2003) pp. 606-611). The active region is the area where a current runs during the on-state.

Furthermore, another instance of the conventional depletion-type MOSFET structure will be described. FIGS. 18 and 19 are sectional views illustrating structures of another instances of the conventional depletion-type MOSFET. The depletion-type MOSFET shown in FIG. 18 (hereinafter, described as a third conventional example) is different from the second conventional example in that a local oxidation of silicon (LOCOS) film 117 formed by such a method for performing LOCOS is, instead of the insulation layer 107, applied to separate the $n^+$-type drain region 105 from the gate electrode 109 in order to promote size reduction.

The depletion-type MOSFET shown in FIG. 19 (hereinafter, described as a fourth conventional example) is different from the second conventional example in that an n-type diffusion region 136 is, instead of extending the n-type offset-diffusion-region 116 over the whole active region, disposed at the part sandwiched between the $n^+$-type source region 103 and the n-type offset-diffusion-region 106 in the p-type well region 102. It is possible to optimize n-type impurity concentration at the part beneath the gate electrode 109 (the part opposite to the gate electrode 109 through the gate dielectric film 108) in the active region. Then current characteristics can be improved (see, for example, Non-patent Literature 2: Y. Toyoda et al., "60V-Class Power IC Technology for an Intelligent Power Switch with an Integrated Trench MOSFET", Proceedings of the $25^{th}$ International Symposium on Power Semiconductor Devices and ICs (ISPSD), 2013 May, pp. 147-150).

However, according to the second to the fourth conventional examples described above, when the depletion-type MOSFET is applied to the reference constant current source in IC, there is a case that a design change is necessary to modify saturation current (current capacity) in order to tune IC characteristics. Next problems will occur. According to the second conventional example, when impurity concentration of the n-type offset-diffusion-region 116 is changed to adjust the saturation current, the impurity concentration come into the optimum value at the part beneath the gate electrode 109 (the part opposite to the gate electrode 109 through the gate dielectric film 108) in the n-type offset-diffusion-region 116. However, the impurity concentration shifts from the optimum around the $n^+$-type drain region 105 in the n-type offset-diffusion-region 116. Then breakdown voltage characteristics cannot be maintained. That is, there is low flexibility in adjusting the impurity concentration of the n-type offset-diffusion-region 106 in order to maintain the breakdown voltage characteristics and to ensure sufficient saturation current.

According to the third conventional example described above, when impurity concentration of the n-type offset-diffusion-region 126 is changed to adjust the saturation current, the breakdown voltage characteristics cannot be maintained as similar to the second conventional example described above. That is, there is low flexibility in adjusting the impurity concentration of the n-type offset-diffusion-region 126 also on the above third conventional example. Further, according to the third conventional example described above, a p-type impurity is taken up from a silicon portion into the LOCOS film 117 by thermal oxidation process for forming the LOCOS film 117. Then the p-type impurity becomes low in concentration at the silicon portion around the interface of the LOCOS film 117. On the other hand, an n-type impurity piled up is redistributed, and the n-type impurity becomes high in concentration at the silicon portion around the interface of the LOCOS film 117. Then, the net impurity concentration of the n-type offset-diffusion-region 126 becomes high at the part beneath the LOCOS film 117 (the part opposite to the LOCOS film 117). In consideration of phenomena described above, it is possible to maintain the breakdown voltage characteristics by optimizing the impurity concentration of the n-type offset-diffusion-region 126. However, in this case, the impurity concentration becomes low at the part beneath the gate electrode 109 in the n-type offset-diffusion-region 126. Then the diffusion depth in the part becomes shallower than that in the other part. Thus sufficient saturation current cannot be ensured.

According to the fourth conventional example described above, it is possible to optimize the n-type impurity concentration of the silicon portions at the parts beneath the LOCOS film 117 and the gate electrode 109 with the aid of the n-type offset-diffusion-region 106 and an n-type diffusion region 136, respectively. Then sufficient saturation current can be ensured. However, the n-type impurity concentration increases at a part 136a where the n-type offset-diffusion-region 106 overlaps the n-type diffusion region 136. Then this might decrease breakdown voltage. Therefore, the upper-limit value is restricted in the range of the impurity concentration for the n-type diffusion region 136.

SUMMARY

In order to solve the problems of the conventional art described above, it is an object of the present invention to provide a semiconductor device in which breakdown voltage characteristics can be maintained to ensure predetermined current capacity and size reduction can be promoted.

In order to solve the problems and to achieve the object of the present invention, according to an aspect of the invention, there is provided a semiconductor device comprising: a second conductive first semiconductor region disposed selectively on a surface layer of a first conductive semiconductor substrate; a first conductive second semiconductor region disposed selectively inside the first semiconductor region; a first conductive third semiconductor region disposed selectively so as to be separated from the second semiconductor region inside the first semiconductor region; a first conductive fourth semiconductor region that is disposed so as to cover the third semiconductor region inside the first semiconductor region and extends over the part sandwiched between the second semiconductor region and the third semiconductor region to be in contact with the second semiconductor region in the first semiconductor region, wherein the first conductive fourth semiconductor region has lower impurity concentration than each of the second semiconductor region and the third semiconductor region; a local dielectric film disposed selectively on the surface layer of the part sandwiched between the second semiconductor region and the third semiconductor region in the fourth semiconductor region; a gate electrode disposed through a gate dielectric film on the surface of the part sandwiched between the local dielectric film and the second semiconductor region in the fourth semiconductor region; a first conductive fifth semiconductor region disposed at a part located toward the second semiconductor region through the local dielectric film in the fourth semiconductor region to be in contact with the second semiconductor region, wherein the first conductive fifth semiconductor region has lower impurity concentration than the fourth semiconductor region; a first electrode being in contact with the second semiconductor region; and a second electrode being in contact with the third semiconductor region.

The fifth semiconductor region may be placed so as to be separated from the local dielectric film.

A plurality of semiconductor elements having the first semiconductor region, the second semiconductor region, the third semiconductor region, the fourth semiconductor region, the fifth semiconductor region, the local dielectric film, the gate dielectric film, and the gate electrode may be disposed in the semiconductor substrate, wherein each of a plurality of the semiconductor elements may have a different distance between the local dielectric film and the fifth semiconductor region.

A depth in the fourth semiconductor region may be shallower at one part sandwiched between the local dielectric film and the second semiconductor region than at the other remaining part.

According to the invention described above, along with promoting size reduction by configuring the offset gate structure including the local dielectric film, it is possible that impurity concentration in the fourth semiconductor region is complemented to optimize at the part beneath the gate electrode with the aid of the fifth semiconductor region disposed at the part beneath the gate electrode (the part opposite to the gate electrode through the gate dielectric film) in the fourth semiconductor region, which is in contact with the second semiconductor region and the third semiconductor region. The fifth semiconductor region can be disposed at the part beneath the gate electrode in the fourth semiconductor region. Then there is nothing to give adverse influence on the breakdown characteristics realized by the fourth semiconductor region. Thus there is a lot of flexibility in adjusting the saturation current.

According to the semiconductor device of the present invention, it is possible to obtain an effect that breakdown voltage characteristics can be maintained to ensure predetermined current capacity, and size reduction can be promoted.

BRIEF DESCRIPTION OF THE DRAWINGS

FIG. 2A is a characteristic profile illustrating an impurity concentration distribution cut along the line A-A' shown in FIG. 1;

FIG. 2B is a characteristic profile illustrating a net impurity concentration distribution at the part beneath a LOCOS film shown in FIG. 1;

DETAILED DESCRIPTION

Figure 1:
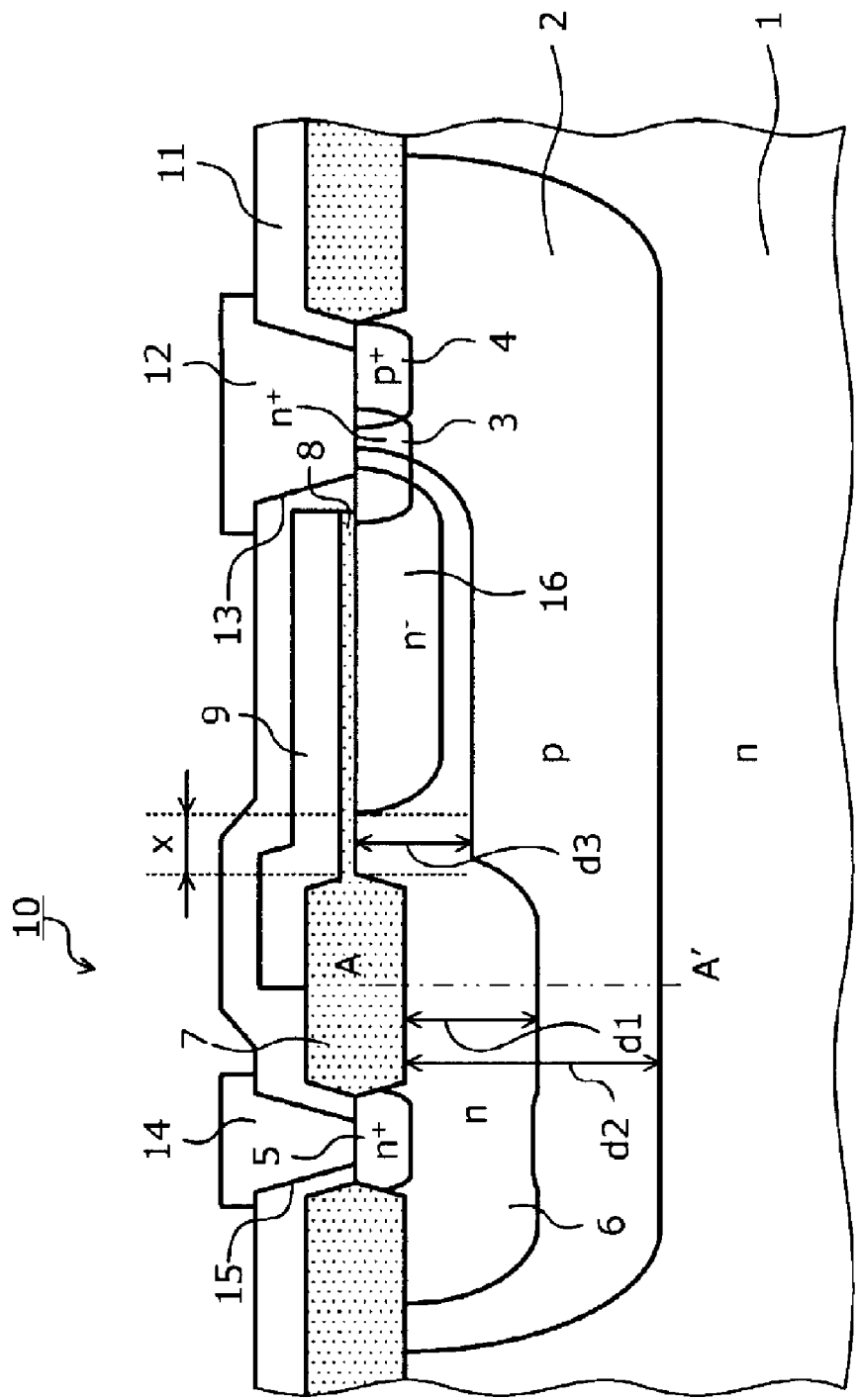
FIG. 1 is a sectional view illustrating a structure of a semiconductor device according to an embodiment.

Hereinafter, referring attached figures, a preferred embodiment of the semiconductor device according to the invention will be described in detail. In the present description and the attached figures, "n" and "p" prefixed to layers and regions indicate that the majority carrier is an electron and a hole, respectively. "+" and "−" appended to an "n" or "p" indicate that the impurity concentration is higher and lower, respectively, than layers and regions without "+" and "−". In addition, according to the description of the embodiment and the attached figures, the same reference numerals are given to identical configurations, and redundant descriptions thereof will be omitted.

EMBODIMENT

A structure of a semiconductor device according to the embodiment will be described using a lateral depletion-type n-channel MOSFET with middle voltage (for example, approximately 80V). FIG. 1 is a sectional view illustrating the structure of the semiconductor device according to the embodiment. FIG. 2A is a characteristic profile illustrating an impurity concentration distribution cut along the line A-A' shown in FIG. 1. FIG. 2B is a characteristic profile illustrating a net impurity concentration distribution at the part beneath a LOCOS film shown in FIG. 1. In a semiconductor device 10 according to the embodiment shown in FIG. 1, a p-type well region (a first semiconductor region) 2 is disposed selectively on a surface layer of an n-type semiconductor substrate (a semiconductor chip) 1. Inside the p-type well region 2, each of an $n^+$-type source region (a second semiconductor region) 3, a $p^+$-type contact region 4, and an $n^+$-type drain region (a third semiconductor region) 5 is disposed selectively so as to be exposed on the substrate surface. The $n^+$-type source region 3 and the $p^+$-type contact region 4 are in contact with each other.

The $n^+$-type drain region 5, which is located at the opposite side to the $p^+$-type contact region 4 through the $n^+$-type source region 3, is placed apart from the $n^+$-type source region 3. Further, inside the p-type well region 2, a first n-type offset-diffusion-region (a fourth semiconductor region) 6 is disposed so as to cover the whole face, which is located at the lower side (the inner side of the substrate) of the $n^+$-type drain region 5. That is, the first n-type offset-diffusion-region 6 is disposed between the $n^+$-type drain region 5 and the p-type well region 2 so as to cover the whole face located at the lower side of the $n^+$-type drain region 5. The diffusion depth determined from the substrate surface in the first n-type offset-diffusion-region 6 is shallower than that in the p-type well region 2. High breakdown voltage is realized by disposing the first n-type offset-diffusion-region 6 in response to the impurity concentration thereof.

Further, the first n-type offset-diffusion-region 6 heads for the $n^+$-type source region 3 side and extends to the part beneath a gate electrode 9 (the part opposite to the gate electrode 9 through a gate dielectric film 8) described later (extending across almost whole active region), being in contact with the $n^+$-type source region 3. Such a depletion-type MOS gate (an insulated gate composed of metal-oxide-semiconductor) structure is configured so that a channel region is formed in the first n-type offset-diffusion-region 6, which is in contact with the $n^+$-type source region 3 and the $n^+$-type drain region 5. The first n-type offset-diffusion-region 6 may cover the whole face located at the lower side of the $n^+$-type source region 3 or may be a part of lower side face of the $p^+$ contact region 4 so that the $p^+$-type contact region 4 is partially in contact with the p-type well region 2 at a predetermined spot.

In the first n-type offset-diffusion-region 6, impurity concentration is lower at the part beneath the gate electrode 9 than at the part beneath the LOCOS film (the local dielectric film) 7 described later (the part opposite to the LOCOS film 7). Moreover, in the first n-type offset-diffusion-region 6, the diffusion depth (namely, the depth of the part sandwiched between the LOCOS film 7 and the $n^+$-type source region 3 in the first n-type offset-diffusion-region 6) determined from the substrate surface (the interface between the gate electrode 9 and the first n-type offset-diffusion-region 6) at the part beneath the gate electrode 9 is shallower than that determined from the substrate surface (the interface between the $n^+$-type drain region 5 and the drain electrode 14) at the part positioned in the LOCOS film 7 side. The reason is as follows.

In the course of forming an oxide film (an $SiO_2$ film), which becomes the LOCOS film 7, on the surface layer of the first n-type offset-diffusion-region 6, and a p-type impurity is taken up from the silicon portion into the LOCOS film 7. This decreases the p-type impurity concentration at the silicon portion around the interface of the LOCOS film 7. On the other hand, the n-type impurity piled up is redistributed, and then the n-type impurity concentration increases at the silicon portion around the interface of the LOCOS film 7. Then the net n-type impurity concentration increases at the part beneath the LOCOS film 7 in the first n-type offset-diffusion-region 6. As shown in FIG. 2B, the diffusion depth (the depth determined from the interface between the LOCOS film 7 and the first n-type offset-diffusion-region 6 in the direction orthogonal to the principal surface of the substrate) d1 also increases at the part beneath the LOCOS film 7 in the first n-type offset-diffusion-region 6. In the first n-type offset-diffusion-region 6, such changes in depth and in the net impurity concentration are affected more significantly by that the LOCOS film 7 takes up the p-type impurity than by that the n-type impurity piled up is redistributed. That is, in the first n-type offset-diffusion-region 6, to what extent the diffusion depth d1, which corresponds to the part beneath the LOCOS film 7, is deepened, is affected deeply by a p-type impurity decrease amount Dp, which stands for the difference between before and after forming the LOCOS film 7, and rather lightly by an n-type impurity increase amount Dn, which stands for the difference between before and after forming the LOCOS film 7. On the other hand, to what extent the n-type impurity piled up is redistributed and to what extent the LOCOS film 7 takes up the p-type impurity are scarcely affected at the part beneath the gate electrode 9 in the first n-type offset-diffusion-region 6. The impurity concentration for both n-type and p-type is maintained to the condition before forming the LOCOS film 7 even after forming the LOCOS film 7. Thus the diffusion depth is equivalent to d3, which stands for a diffusion depth before forming the LOCOS film 7.

Though it is not limited especially, when a semiconductor device according to the embodiment has 80V-class breakdown voltage, it takes the following values for impurity concentration of the first n-type offset-diffusion-region 6 and the p-type well region 2 (FIG. 2A). In the first n-type offset-diffusion-region 6, the peak impurity concentration may be, for example, approximately equal to or more than $2\times10^{17}$ atoms/cm$^3$ and equal to or less than $3\times10^{17}$ atoms/cm$^3$ at the part beneath the LOCOS film 7. In the p-type well region 2, the peak impurity concentration may be, for example, approximately equal to or more than $2\times10^{16}$ atoms/cm$^3$ and equal to or less than $3\times10^{16}$ atoms/cm$^3$ at the part beneath the LOCOS film 7. The diffusion depth d1 may be, for example, approximately equal to or more than 0.5 μm and equal to or less than 0.9 μm at the part beneath the LOCOS film 7 in the first n-type offset-diffusion-region 6. In the p-type well region 2, the diffusion depth at the part beneath the LOCOS film 7 (the depth, which is in the direction orthogonal to the principal surface of the substrate, determined from the interface between the LOCOS film 7 and the first n-type offset-diffusion-region 6 in the p-type well region 2) d2 may be, for example, approximately equal to or more than 3 μm and equal to or less than 4 μm. In addition, the absence of the LOCOS film 7 on the n$^+$-type drain region 5 causes the diffusion depth from the substrate surface to become slightly shallower at one part beneath the n$^+$-type drain region 5 (the part opposite to the n$^+$-type drain region 5) than at the other part located at the LOCOS film 7 side in the first n-type offset-diffusion-region 6.

The LOCOS film 7, which is formed so that the first n-type offset-diffusion-region 6 is thermally oxidized at the surface layer, is locally disposed on a part sandwiched between the n$^+$-type drain region 5 and the n$^+$-type source region 3 in the first n-type offset-diffusion-region 6. The gate electrode 9 is disposed through the gate dielectric film 8 on the surface of the part sandwiched between the n$^+$-type source region 3 and the LOCOS film 7 in the first n-type offset-diffusion-region 6. An end portion, which is located at the n$^+$-type drain region 5 side, of the gate electrode 9 extends on the LOCOS film 7. The LOCOS film 7 separates the n$^+$-type drain region 5 from the gate electrode 9. This causes the distance to become large between the n$^+$-type drain region 5 and the gate electrode 9. Thus an offset gate structure is configured so that the position of the gate electrode 9 is biased toward the n$^+$-type source region 3.

Figure 16:
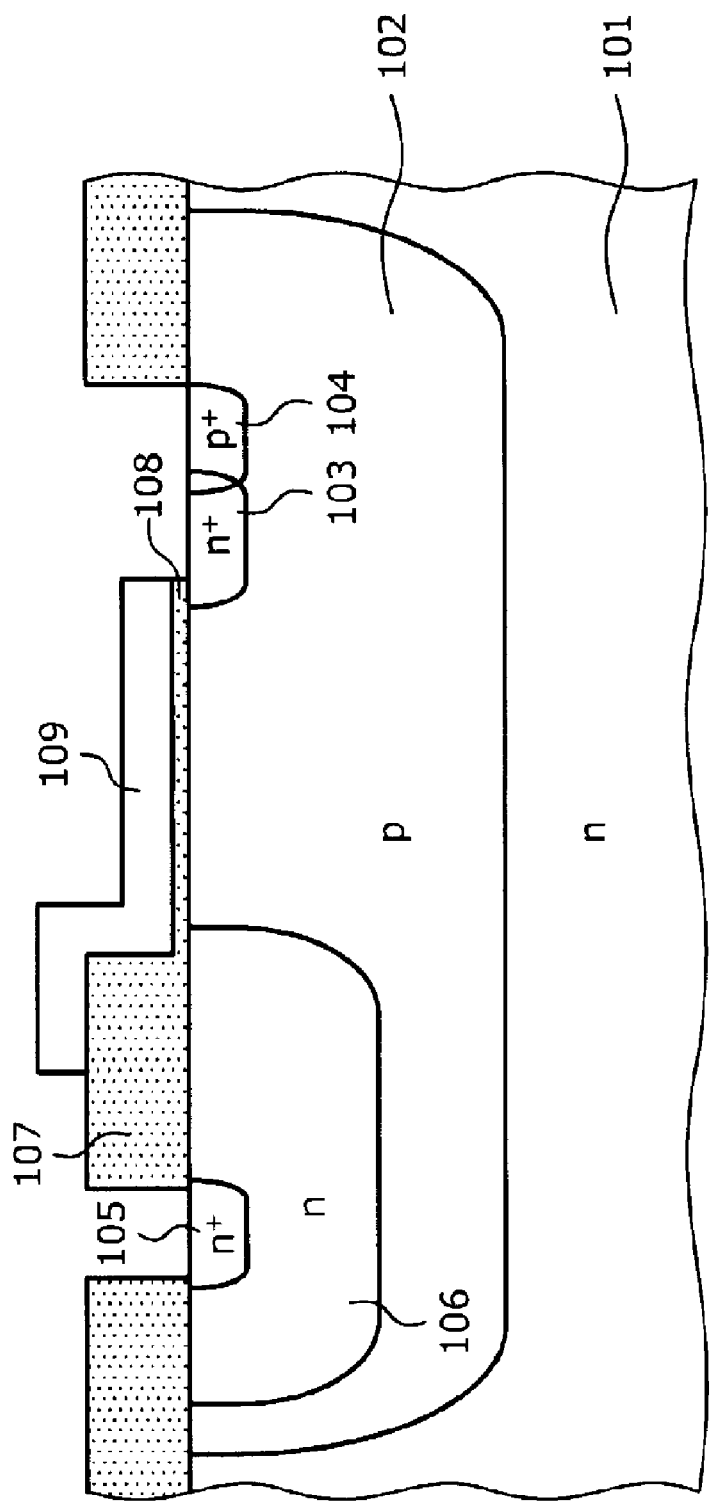
FIG. 16 is a sectional view illustrating a structure of a conventional enhancement-type MOSFET.
Figure 17:
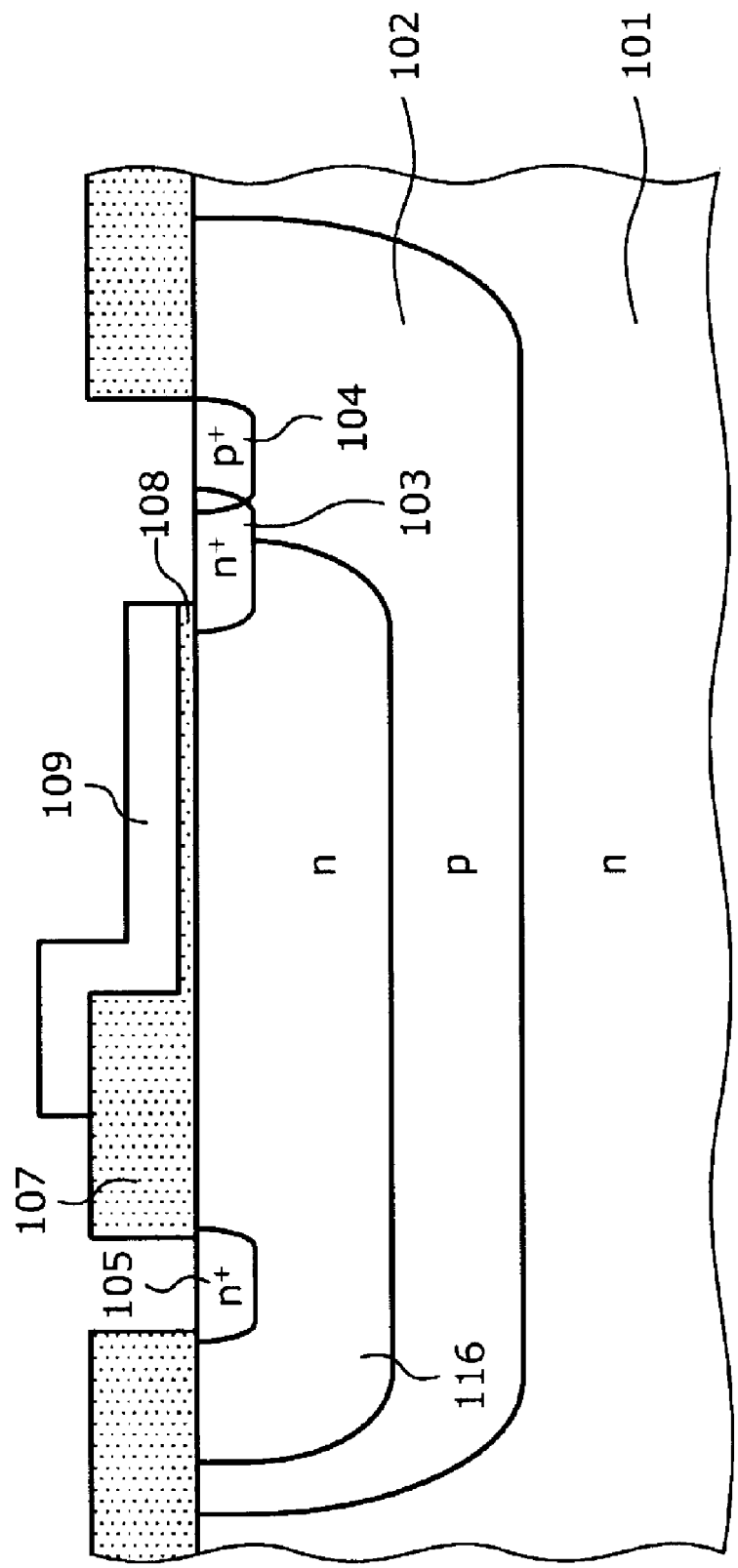
FIG. 17 is a sectional view illustrating a structure of a conventional depletion-type MOSFET.
Figure 18:
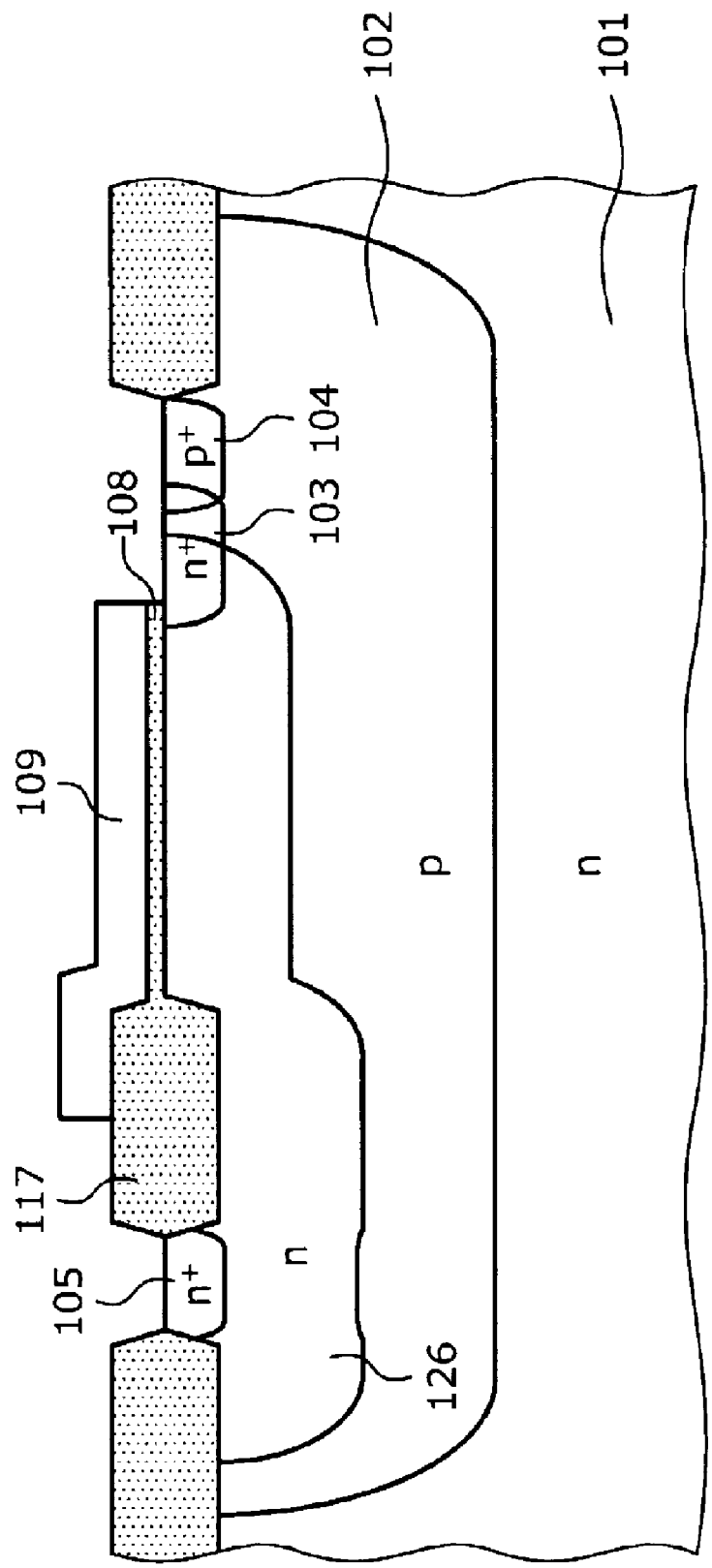
FIGS. 18 and 19 are sectional views illustrating structures of another instances of the conventional depletion-type MOSFET.
Figure 19:
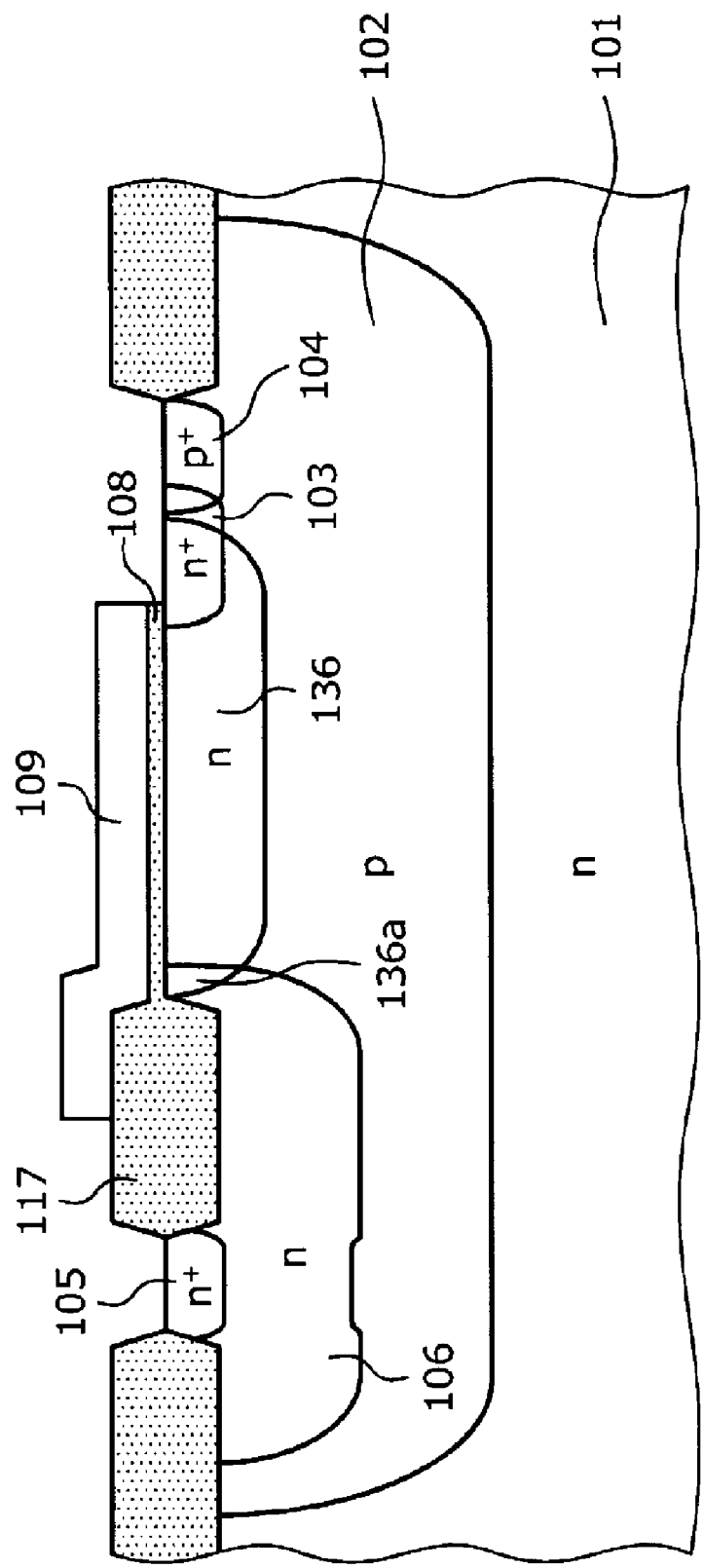

The use of the offset gate structure as described above can prevent electric field from concentrating at an end portion, which is located at the drain region 5 side, of the gate electrode 9. Then breakdown voltage can be improved. Further, size reduction can be promoted by forming the offset gate structure using the LOCOS film 7 in comparison with forming the offset gate structure using the dielectric layer disposed on the substrate as described in the first and the second conventional examples (FIGS. 16 and 17). The LOCOS film 7 is disposed not only outside the n$^+$-type drain region 5 but also outside the p$^+$-type contact region 4, separating the offset gate structure electrically from the other elements not shown.

Inside the first n-type offset-diffusion-region 6, a second n$^-$-type offset-diffusion-region (a fifth semiconductor region) 16 is disposed selectively at a part located toward the n$^+$-type source region 3 (namely, a part beneath the gate electrode 9) through the LOCOS film 7. The second n$^-$-type offset-diffusion-region 16 is in contact with the n$^+$-type source region 3. The second n$^-$-type offset-diffusion-region 16 may cover the whole face located at the lower side of the n$^+$-type source region 3 or may a part of the lower side face of the p$^+$-type contact region 4 so that the p$^+$-type contact region 4 is partially in contact with the p-type well region 2 at a predetermined spot. In the second n$^-$-type offset-diffusion-region 16, the depth is changeable variously in accordance with design requirement and may be deeper or shallower than that of the first n-type offset-diffusion-region 6.

The second n$^-$-type offset-diffusion-region 16 has a function that complements to optimize impurity concentration, which runs short at the part beneath the gate electrode 9, in the first n-type offset-diffusion-region 6 because of setting the impurity concentration of the first n-type offset-diffusion-region 6 in consideration of taking up the p-type impurity and of redistributing the n-type impurity piled up as described above. That is, the disposition of the second n$^-$-type offset-diffusion-region 16 allows impurity concentration to increase at the part beneath the gate electrode 9 in the first n-type offset-diffusion-region 6, achieving predetermined saturation current. The impurity concentration of the second n$^-$-type offset-diffusion-region 16 is lower than that of the part beneath the LOCOS film 7 in the first n-type offset-diffusion-region 6. Then, even though the n-type impurity concentration is complemented by the second n$^-$-type offset-diffusion-region 16 at a part beneath the gate electrode 9 in the first n-type offset-diffusion-region 6, the n-type impurity concentration will not become too high at the part. Then there is nothing to give adverse influence on breakdown voltage characteristics and current characteristics.

Further, the second n$^-$-type offset-diffusion-region 16 is preferably placed so as to be separated from the LOCOS film 7, which is placed between the second n$^-$-type offset-diffusion-region 16 and the n$^+$-type drain region 5. The reason is as follows. In the p-type well region 2, impurity concentration becomes low at the part beneath the LOCOS film 7 because the p-type impurity is taken up as described above. Then if the n-type impurity concentration becomes excessively high at the part beneath the LOCOS film 7, an effective width, which is sandwiched between an n-type region (a part remaining as the n-type region located at the back surface side of the n-type semiconductor substrate 1) and the first n-type offset-diffusion-region 6, of the p-type well region 2 decreases, causing punch-through to occur easily between both n-type regions. The placement of the second n$^-$-type offset-diffusion-region 16 separated from the LOCOS film 7 can prevent the impurity concentration from becoming high excessively at the part beneath the LOCOS film 7 in the first n-type offset-diffusion-region 6. Then punch-through can be prevented from occurring at the p-type well region 2.

A distance x, which corresponds to the distance from the LOCOS film 7 placed between the second n$^-$-type offset-diffusion-region 16 and the n$^+$-type drain region 5 to one end portion of the second n$^-$-type offset-diffusion-region 16 in which the one end portion is located at the n$^+$-type drain region 5 side (hereinafter, described as a distance between the second n$^-$-type offset-diffusion-region 16 and the LOCOS film 7), is changeable variously in accordance with design requirement. It is possible to adjust saturation current by adjusting the distance x between the second n$^-$-type offset-diffusion-region 16 and the LOCOS film 7 without changing the impurity concentration of the second n$^-$-type offset-diffusion-region 16. Concretely, the more the distance x between the second n$^-$-type offset-diffusion-region 16 and the LOCOS film 7 widens, the lower the saturation current becomes.

An interlayer dielectric film 11 is disposed so as to cover the gate electrode 9 on the surface of the n-type semiconductor substrate 1. A source electrode (a first electrode) 12, which is in contact with the n$^+$-type source region 3 and the p$^+$-type contact region 4 through a contact hole 13 penetrating the interlayer dielectric film 11 in the depth direction, is insulated electrically from the gate electrode 9 by the interlayer dielectric film 11. A drain electrode (a second electrode) 14 is in contact with the n+-type drain region 5 through a contact hole 15 penetrating the interlayer dielectric film 11 in the depth direction. Although element structures except the components described above are omitted, the surface of the n-type semiconductor substrate 1 is protected by a passivation film. Further a general interconnection structure including electrode pads such as a source pad and a gate pad is configured on the n-type semiconductor substrate 1.

Figure 3:
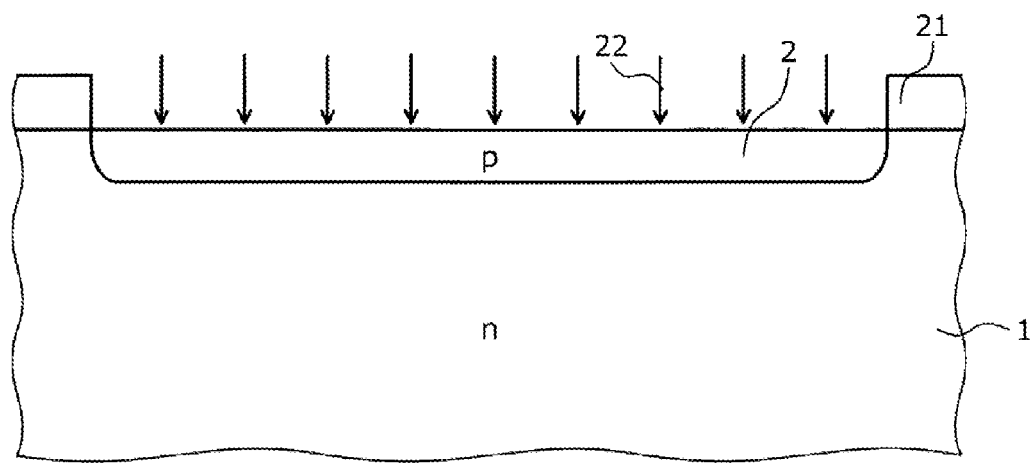
FIGS. 3 to 12 are sectional views illustrating states in the course of manufacturing the semiconductor device according to the embodiment.
Figure 4:
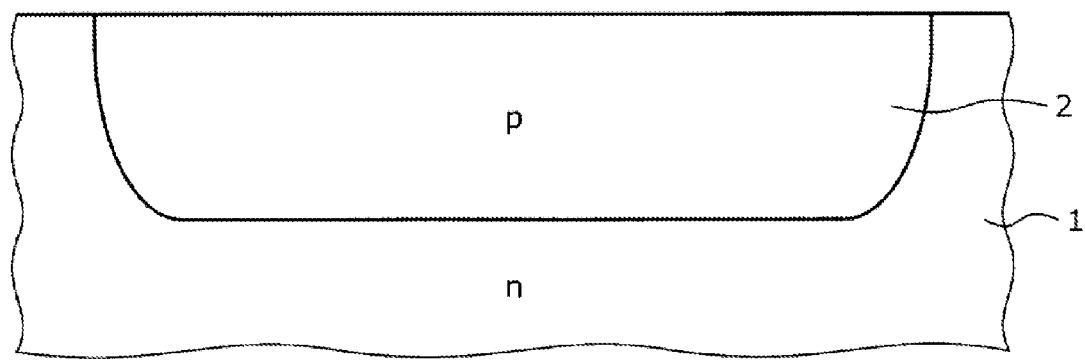

Next, a method for manufacturing a semiconductor device 10 according to the embodiment will be described. FIGS. 3 to 12 are sectional views illustrating states in the course of manufacturing the semiconductor device according to the embodiment. Initially, as shown in FIG. 3, an ion implantation mask 21, in which the part corresponding to an area where the p-type well region 2 will be formed is exposed, is formed by photo-lithography on the surface of the n-type semiconductor substrate (semiconductor wafer) 1. Next, the p-type well region 2 is formed selectively by ion implantation 22 with a p-type impurity using the ion implantation mask 21 as a mask on the surface layer of the n-type semiconductor substrate 1. Next, as shown in FIG. 4, the performance of thermal process causes the p-type well region 2 to diffuse after removing the ion implantation mask 21.

Figure 5:
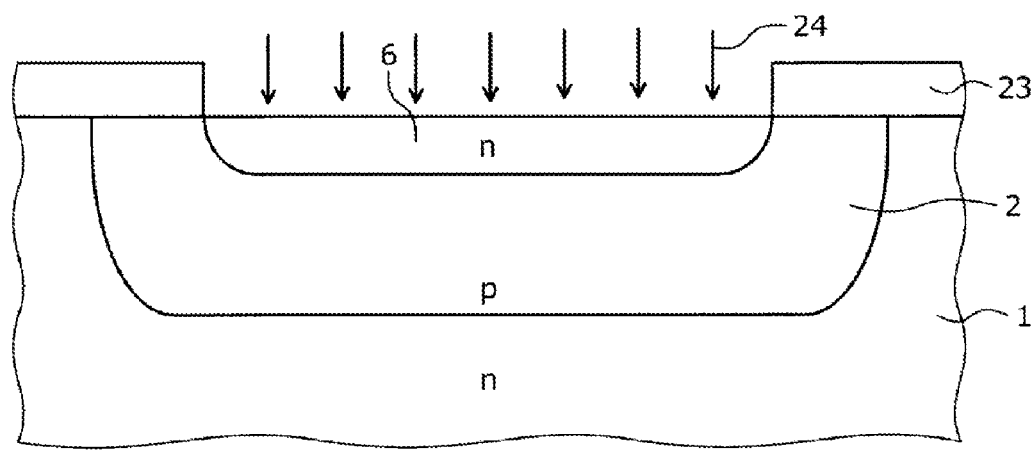
Figure 6:
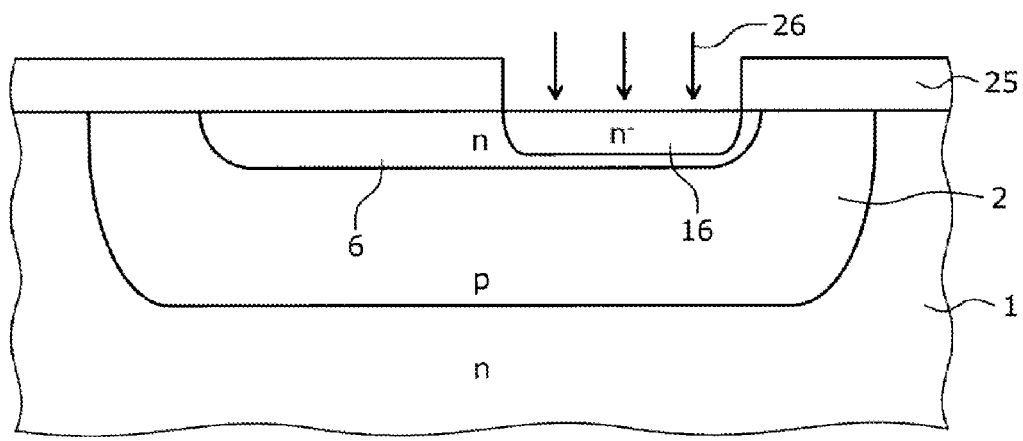

Next, as shown in FIG. 5, an ion implantation mask 23, in which the part corresponding to an area where the first n-type offset-diffusion-region 6 will be formed is exposed, is formed by photo-lithography on the surface of the n-type semiconductor substrate 1. Next, the first n-type offset-diffusion-region 6 is formed selectively by ion implantation 24 with an n-type impurity using the ion implantation mask 23 as a mask inside the p-type well region 2. Next, as shown in FIG. 6, an ion implantation mask 25, in which the part corresponding to an area where the second n−-type offset-diffusion-region 16 will be formed is exposed, is formed by photo-lithography on the surface of the n-type semiconductor substrate 1 after removing the ion implantation mask 23.

Figure 7:
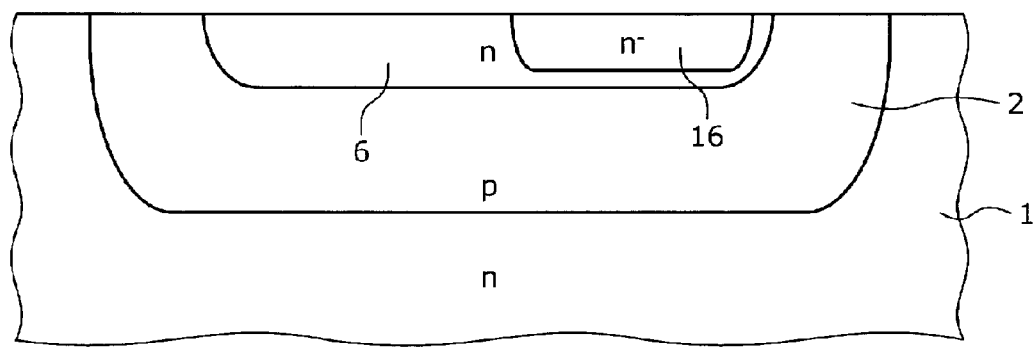
Figure 8:
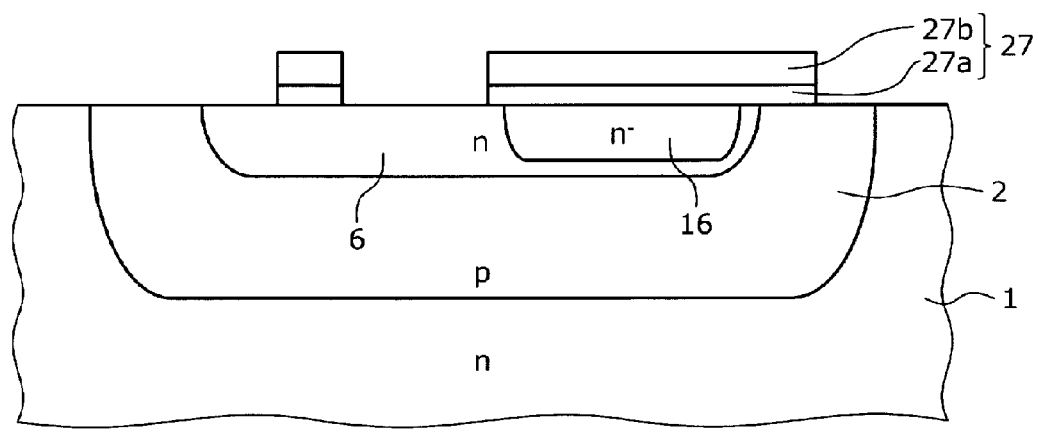

Next, the second n−-type offset-diffusion-region 16 is formed selectively by ion implantation 26 with an n-type impurity using the ion implantation mask 25 as a mask inside the first n-type offset-diffusion-region 6. Next, as shown in FIG. 7, the first n-type offset-diffusion-region 6 and the second n−-type offset-diffusion-region 16 are diffused after removing the ion implantation mask 25. Next, as shown in FIG. 8, a silicon oxide film 27a and a silicon nitride film (a SiN film) 27b are deposited in order on the surface of the n-type semiconductor substrate 1. Next, the silicon oxide film 27a and the silicon nitride film 27b are patterned by photo-lithography and etching. This results in exposure of the part corresponding to an area where the LOCOS film 7 will be formed.

Figure 9:
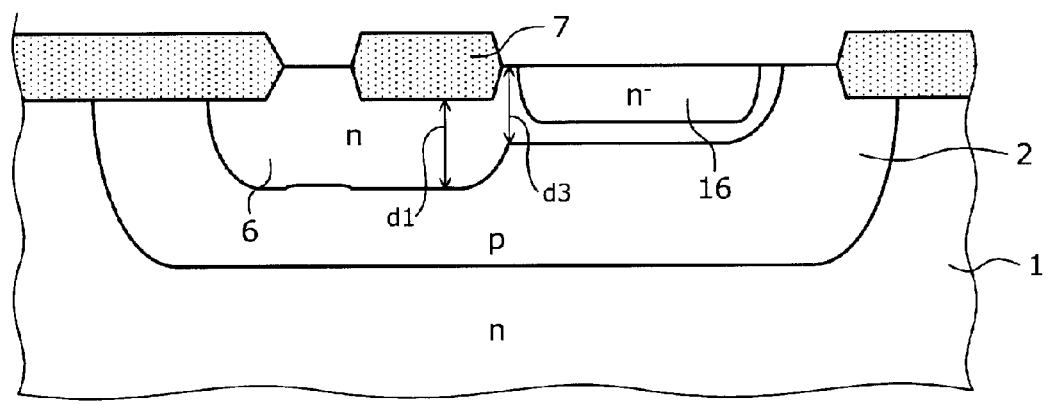

Next, as shown in FIG. 9, the silicon portion exposed at the opening part of the LOCOS mask 27 is oxidized thermally to form locally an oxide film (a SiO₂ film), which becomes the LOCOS film 7, by LOCOS techniques employing the remaining portion of the silicon oxide film 27a and the silicon nitride film 27b as a mask (hereinafter, described as a LOCOS mask) 27. During thermal oxidation to form the LOCOS film 7, the p-type impurity concentration decreases at the silicon portion around the interface of the LOCOS film 7 because the p-type impurity is taken up and the n-type impurity piled up redistributes as described above. This allows the net impurity concentration of the first n-type offset-diffusion-region 6 to increase at the part beneath the locos film 7. Then, this causes the diffusion depth determined from the substrate surface in the first n-type offset-diffusion-region 6 to become deeper at the part where the LOCOS film 7 is located than at the part beneath the gate electrode 9.

Figure 10:
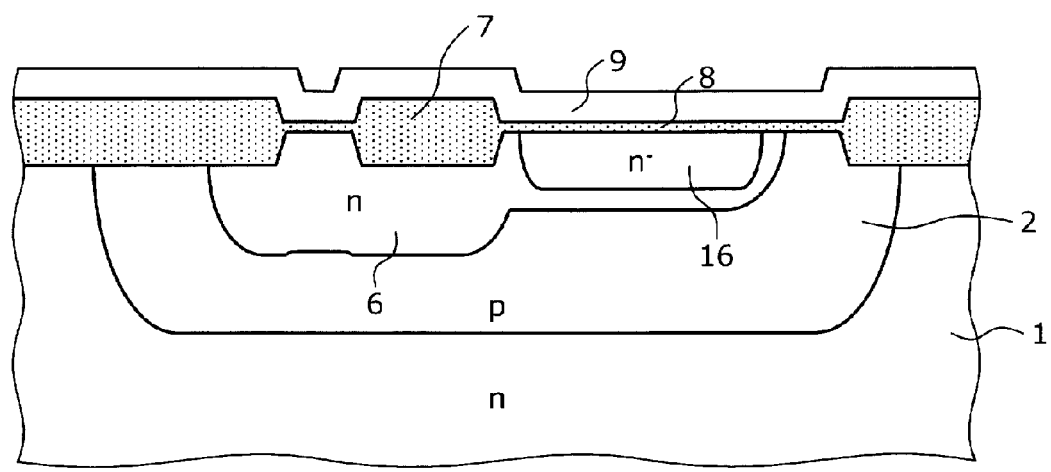
Figure 11:
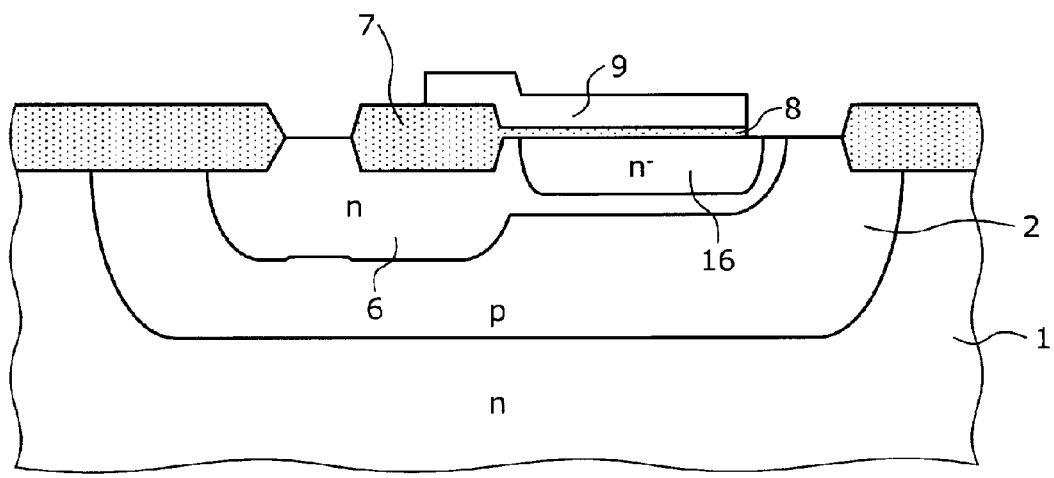

Next, after removing the LOCOS mask 27 (the silicon nitride film 27b and the silicon oxide film 27a located thereunder), as shown in FIG. 10, the silicon portion exposed between pieces of the LOCOS film 7 is oxidized thermally to form the gate dielectric film 8 composed of an oxide film (SiO₂). Next, a poly-silicon (poly-Si) layer that becomes the gate electrode 9 is formed on the LOCOS film 7 and the gate electrode 8. Next, as shown in FIG. 11, the poly-silicon layer is patterned by photo-lithography and etching. This causes a part of the poly-silicon layer to remain as the gate electrode 9 spreading over from the second n−-type offset-diffusion-region 16 to the first n-type offset-diffusion-region 6.

Figure 12:
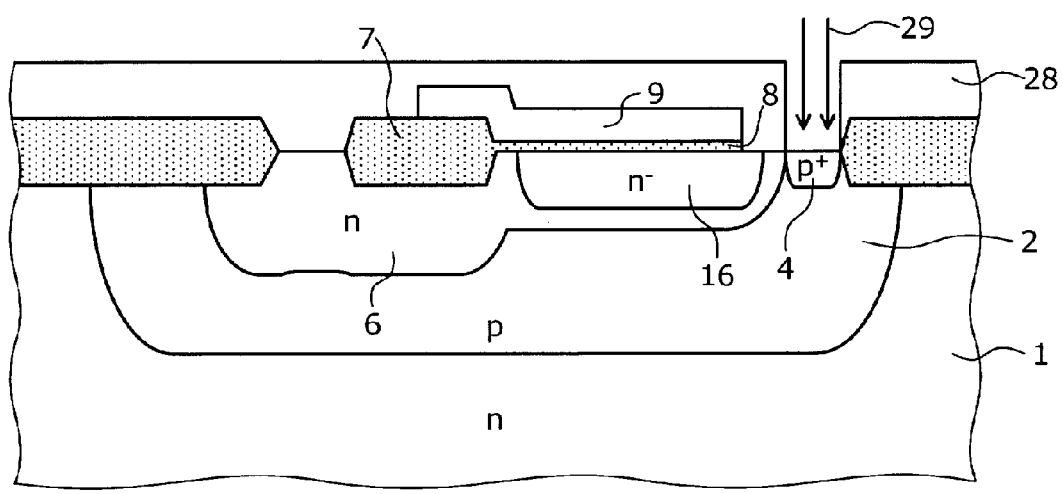

Next, a part, in which the part corresponding to areas where the n+-type source region 3, the p+-type contact region 4, and the n+-type drain region 5 will be formed, is exposed by etching. Next, as shown in FIG. 12, an ion implantation mask 28, in which the part corresponding to an area where the p+-type contact region 4 will be formed is exposed, is formed by photo-lithography on the surface of the n-type semiconductor substrate 1. Next, the p+-type contact region 4 is formed selectively by ion implantation 29 with the p-type impurity using the ion implantation mask 28 inside the p-type well region 2.

Next, after removing the ion implantation mask 28, an ion implantation mask (not shown), in which the part corresponding to areas where the n+-type source region 3 and the n+-type drain region 5 will be formed is exposed, is formed by photo-lithography on the surface of the n-type semiconductor substrate 1. Next, the n+-type drain region 5 is formed selectively by ion implantation with an n-type impurity using this ion implantation mask as a mask inside the first n-type offset-diffusion-region 6, along with the formation of the n+-type source region 3 selectively inside the p-type well region 2.

Next, the n+-type source region 3, the p+-type contact region 4, and the n+-type drain region 5 are activated after removing the ion implantation mask employed for forming the n+-type source region 3 and the n+-type drain region 5. Next, the remaining element structures are formed by applying a general method for the interlayer dielectric film 11, the source electrode 12, the drain electrode 14, a passivation film not shown, and the like on the surface of the n-type semiconductor substrate 1. Afterward, another interconnection process is generally performed to complete the depletion-type n-channel MOSFET with middle voltage shown in FIG. 1.

Figure 13:
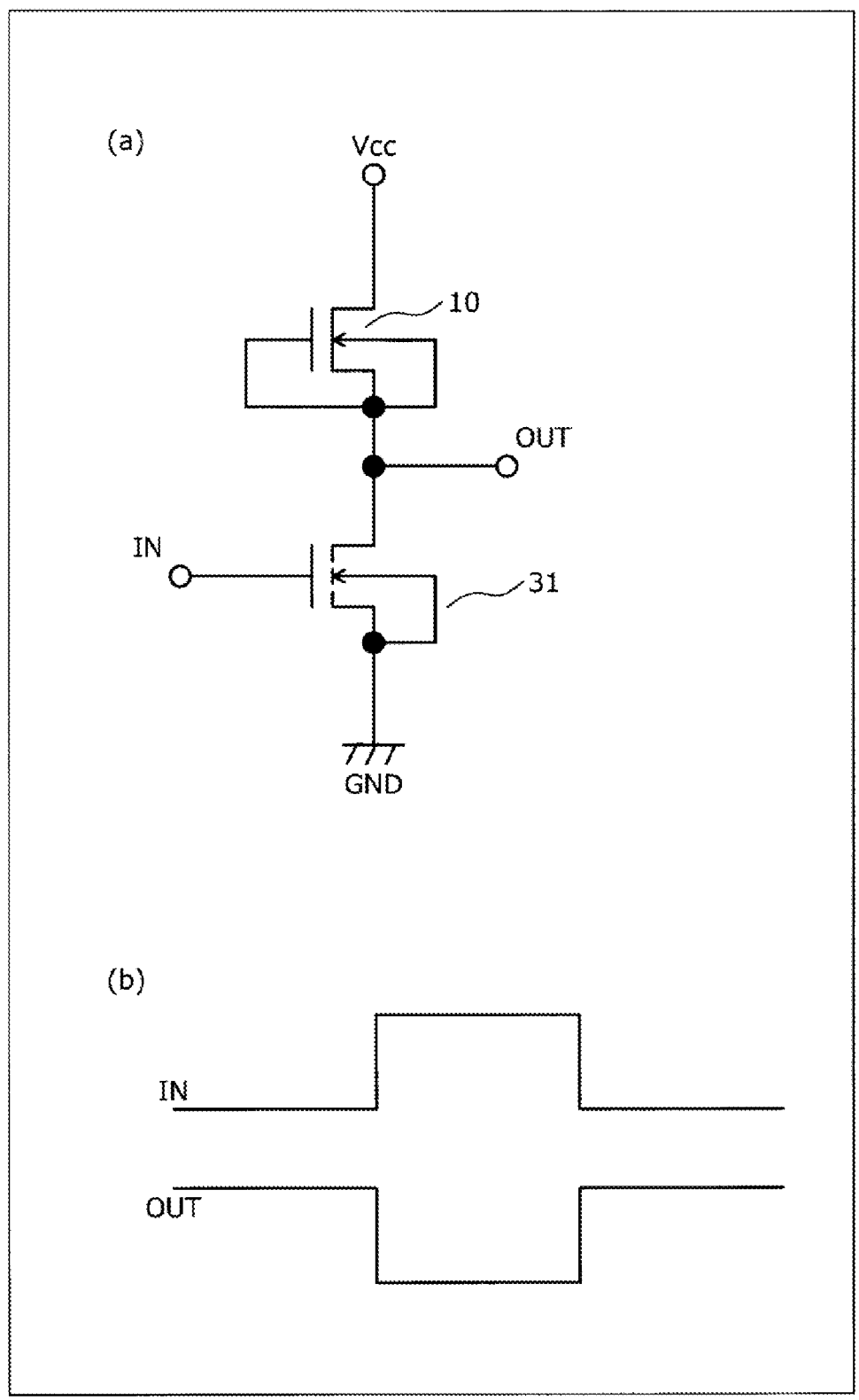
FIGS. 13 and 14 are explanatory diagrams illustrating instances of circuit configured using the semiconductor device according to the embodiment.
Figure 14:
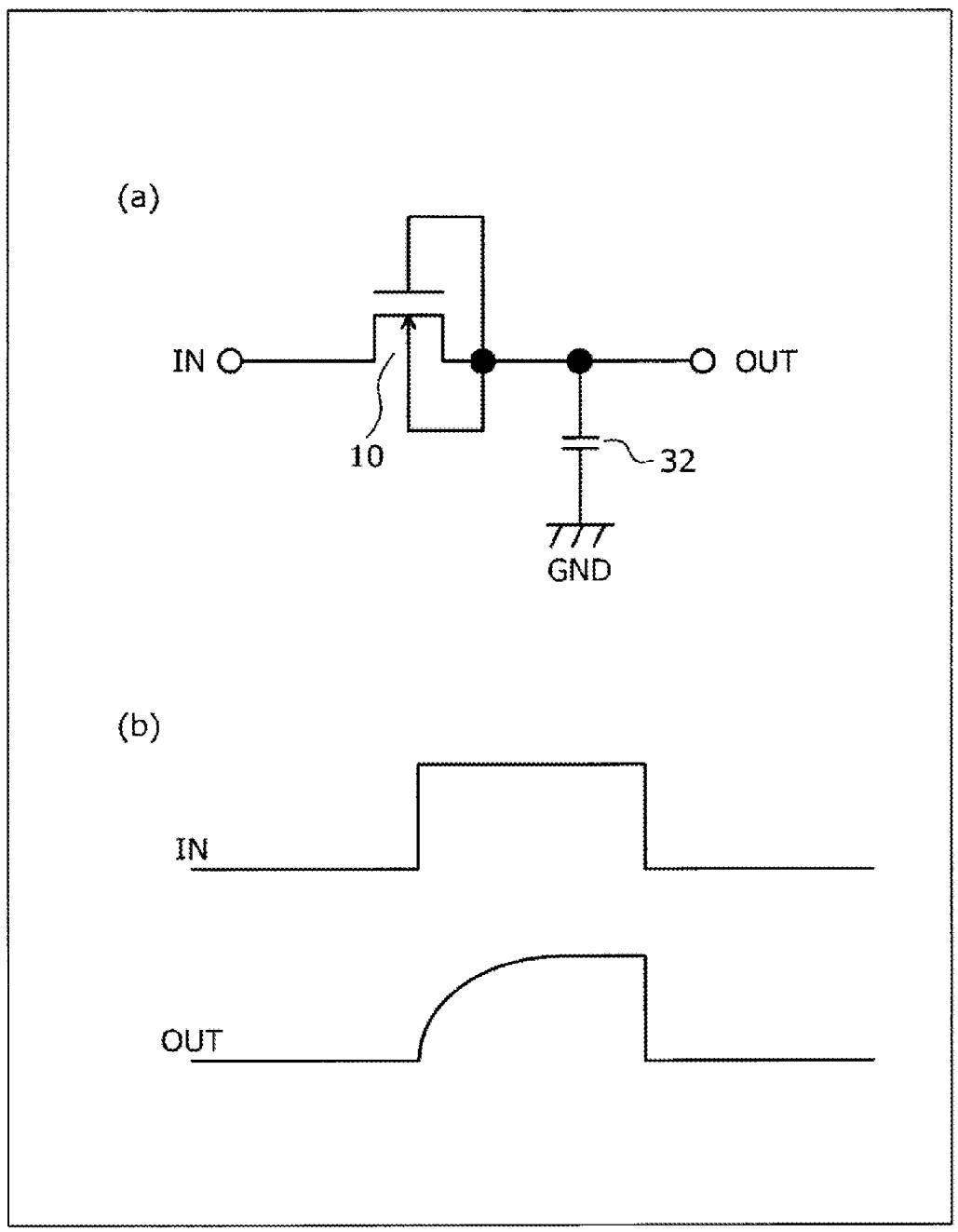

Next, an instance of circuit configured using the semiconductor device 10 according to the embodiment (hereinafter, described as the depletion-type n-channel MOSFET) will be described. FIGS. 13 and 14 are explanatory diagrams illustrating instances of circuit configured using the semiconductor device according to the embodiment. In FIGS. 13 and 14, (a) shows a circuit diagram, and (b) illustrates an input-output signal wave form performed by the circuit (a). As shown in FIG. 13, an inverter circuit, for example, may be configured using the depletion-type n-channel MOSFET 10 according to the embodiment. The inverter circuit shown in FIG. 13 is configured so that the depletion-type n-channel MOSFET 10 is connected in series to an enhancement-type n-channel MOSFET 31 between the ground terminal GND having ground potential and the power supply terminal Vcc to which power supply voltage is applied. Then a pulse signal is input from the input terminal IN to invert the phase, and then the inverted pulse signal output from the output terminal OUT.

Concretely, the gate of the enhancement-type n-channel MOSFET 31 is connected to the input terminal IN. The source and the base of the enhancement-type n-channel MOSFET 31 are connected to the ground terminal GND. The drain of the enhancement-type n-channel MOSFET 31 is connected to the source of the depletion-type n-channel MOSFET 10. The point connecting between the drain of the enhancement-type n-channel MOSFET 31 and the source of the depletion-type n-channel MOSFET 10 is connected to the output terminal OUT. The gate (the gate electrode 9) and the base (the n-type semiconductor substrate 1) of the depletion-type n-channel MOSFET 10 are connected to the source of the depletion-type n-channel MOSFET 10. The drain of the depletion-type n-channel MOSFET 10 is connected to the power supply terminal Vcc.

Further, as shown in FIG. 14, a filter, for example, may be configured by using the depletion-type n-channel MOSFET 10 according to the embodiment. The filter shown in FIG. 14 can adjust charging time so that the depletion-type n-channel MOSFET 10 decreases charging current (saturation current) to a capacitor 32 when charging a current to the capacitor 32. Concretely, the drain of the depletion-type n-channel MOSFET 10 is connected to the input terminal IN. The gate and the base of the depletion-type n-channel MOSFET 10 is connected to the source of the depletion-type n-channel MOSFET 10. The source of the depletion-type n-channel MOSFET 10 is connected to the output terminal OUT. One end portion of the capacitor 32 is connected to the drain of the depletion-type n-channel MOSFET 10, and the other end portion to the ground terminal GND.

Figure 15:
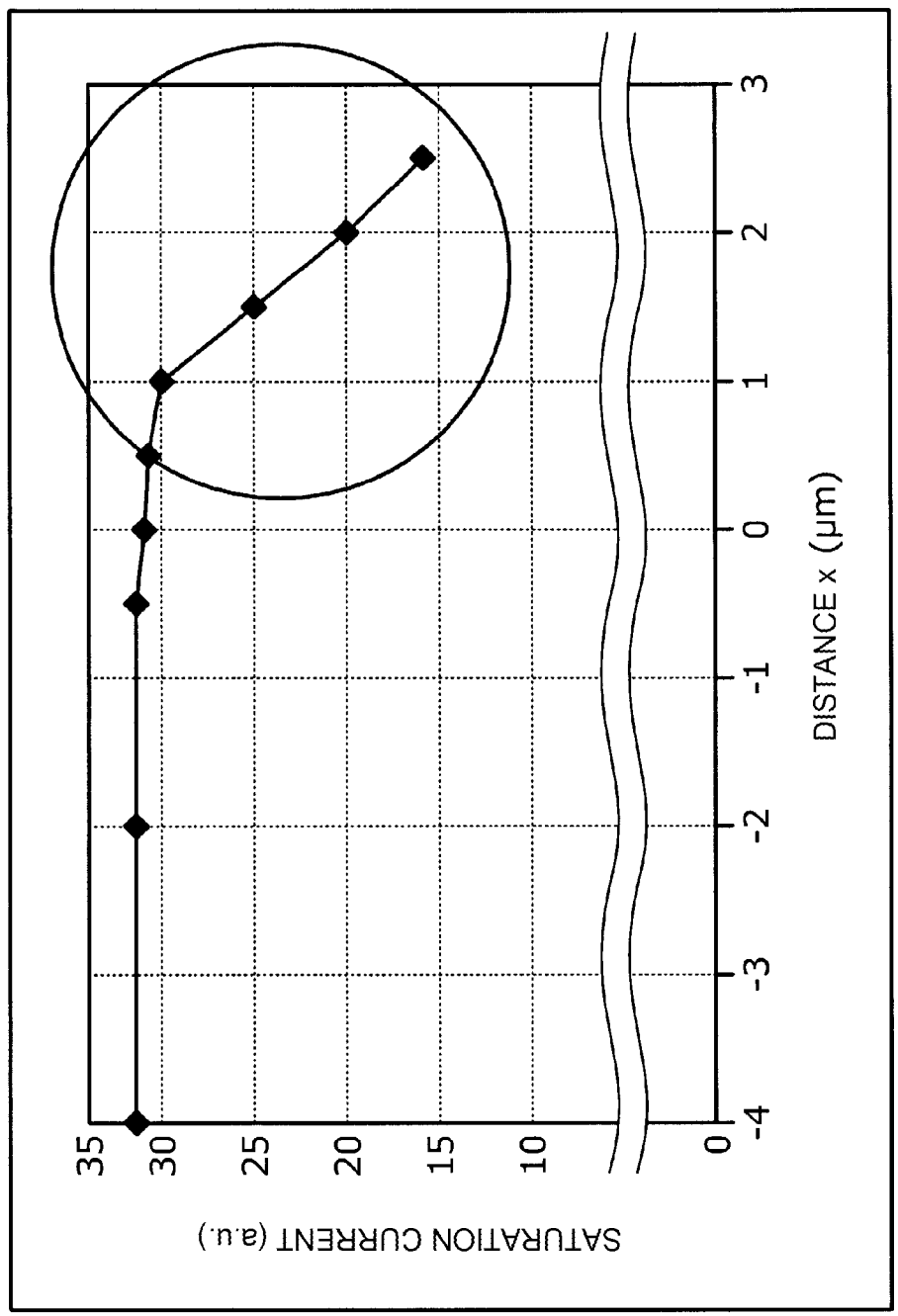
FIG. 15 is a characteristic chart illustrating saturation current of the semiconductor device according to the embodiment.

Next, the relation of saturation current to the distance x between the second $n^-$-type offset-diffusion-region 16 and the LOCOS film 7 will be described. FIG. 15 is a characteristic chart illustrating saturation current of the semiconductor device according to the embodiment. Initially, a plurality of samples (hereinafter, described as examples), in which each sample has a different distance x between the second $n^-$-type offset-diffusion-region 16 and the LOCOS film 7, are fabricated in accordance with the method for manufacturing the semiconductor device according to the embodiment described above. In the examples, it takes $1.2 \times 10^{13}$ ions/cm$^2$ for a dose of the ion implantation 22 to form the p-type well region 2. It takes $4.0 \times 10^{12}$ ions/cm$^2$ for a dose of the ion implantation 24 to form the first n-type offset-diffusion-region 6. It takes $1.0 \times 10^{12}$ ions/cm$^2$ for a dose of the ion implantation 26 to form the second $n^-$-type offset-diffusion-region 16.

Furthermore, it takes 0.5 µm for the diffusion depth d1 at the part beneath the LOCOS film 7 in the first n-type offset-diffusion-region 6. It takes 4.0 µm for the diffusion depth d2 at the part beneath the LOCOS film 7 in the p-type well region 2. In the first n-type offset-diffusion-region 6, it takes 25 µm for a distance from an end portion, which is located at the $n^+$-type drain region 5 side, of the part beneath the gate electrode 9, at which the diffusion depth determined from the substrate surface is shallower than at the part located at the LOCOS film 7 side, to one end portion, which is located at the $n^+$-type drain region 5 side, of the $n^+$-source region 3. Then each of the saturation current is determined about the examples, and thus the result, which is verified about the relation of the saturation current to the distance x between the LOCOS film 7 and the second $n^-$-type offset-diffusion-region 16, is shown in FIG. 15.

In FIG. 15, the point that the distance x is 0 µm between the LOCOS film 7 and the second $n^-$-type offset-diffusion-region 16 indicates an end portion, which is located at the $n^+$-type source region 3 side, of the LOCOS film 7 disposed between the $n^+$-type drain region 5 and the $n^+$-type source region 3. The starting point (x=0) on the horizontal axis in FIG. 5 and the distance x are determined on the basis of two end portions that include one located at the $n^+$-type drain region 5 side in the opening portion of the ion implantation mask 25 employed when forming the second $n^-$-type offset-diffusion-region 16 and the other located at the $n^+$-type source region 3 side in the opening portion of the LOCOS mask 27 employed when forming the LOCOS film 7. As a result shown in FIG. 15, it is identified that the more the distance x between the LOCOS film 7 and the second n-type offset diffusion region 16 widens, the lower the saturation current becomes (see the part circled).

Therefore, in the case of changing current capacity of the depletion-type MOSFET to which the present invention is applied, it is possible to adjust the saturation current by changing the distance x between the LOCOS film 7 and the second $n^-$-type offset-diffusion-region 16 without accompanying significant design change under maintaining the impurity concentration of the first n-type offset-diffusion-region 6 and the second $n^-$-type offset-diffusion-region 16. For example, a channel length L and a channel width W can be set to the minimum dimensions by changing the distance x between the LOCOS film 7 and the second $n^-$-type offset-diffusion-region 16 to adjust the saturation current. Then this results in promotion of size reduction in comparison with the case of tuning the channel length L and the channel width W to modify the saturation current. The channel length L indicates the minimum distance between the $n^+$-type source region 3 and the $n^+$-type drain region 5. The channel width W indicates the width, which is located in the direction orthogonal to the channel length L, of the channel. The thing that tunes the channel length L and the channel width W implies that an increase in ratio of the channel width W to the channel length L causes the saturation current to increase or that a decrease in ratio of the channel width W to the channel length L causes the saturation current to decrease by stretching the channel length L.

Further, the depletion-type MOSFET to which the present invention is applied can configure a reference constant current source as one unit. For example, in the case of fabricating (manufacturing) an IC placing a plurality of the reference constant current sources in which each has different current capacity on one semiconductor chip, it is sufficient to place a plurality of depletion-type MOSFETs in which each has different distance x between the LOCOS film 7 and the second $n^-$-type offset-diffusion-region 16. Then layout design becomes much easier because there is no need to change an element structure of the depletion-type MOSFET. Moreover, the distance x can be modified easily between the LOCOS film 7 and the second $n^-$-type offset-diffusion-region 16 by changing a mask for forming the second $n^-$-type offset-diffusion-region 16. Then major changes about layout and manufacturing process, which are accompanied by design change, will not occur. Furthermore, the depletion-type MOSFET to which the present invention is applied can be employed as a resistor for adjusting current density such as adjusting discharge time of current running in a circuit. For example, in the case of getting the current density to lower, a smaller size resistor having higher resistance can be configured when employing the depletion-type MOSFET to which the present invention is applied as the resistor than when employing another resistor composed of common electric-resistive material. As mentioned above, a plurality of the depletion-type MOSFETs, in which each has different distance x between the LOCOS film 7 and the second $n^-$-type offset-diffusion-region 16, can be placed on one semiconductor chip by applying the present invention. Then it is possible to fabricate an IC including an inverter (FIG. 13), a filter (FIG. 14), a reference constant current source, a resistor, and the like, which are configured with the depletion-type MOSFETs of which each has different saturation current (current capacity).

As described above, according to the embodiment, an offset gate structure including LOCOS is configured, and a second n⁻-type offset-diffusion-region is disposed with predetermined impurity concentration at a part beneath a gate electrode (a part opposite to a gate electrode through a gate dielectric film) in a first n-type offset-diffusion-region, which is in contact with an n⁺-type source region and a n⁺-type drain region. Then it is possible that impurity concentration is complemented to become optimum at the part beneath the gate electrode in the first n-type offset-diffusion-region. The second n⁻-type offset-diffusion-region is disposed beneath the gate electrode in the first n-type offset-diffusion-region. Then there is nothing to give adverse influence on breakdown voltage characteristics realized by the first n-type offset-diffusion-region. Thus there is a lot of flexibility in adjusting the impurity concentration (adjusting saturation current) in the second n⁻-type offset-diffusion-region.

Further, according to the embodiment, the second n⁻-type offset-diffusion-region is disposed inside the first n-type offset-diffusion-region. Then there is no need that impurity concentration is set to be high for the second n⁻-type offset-diffusion-region. Thus this can prevent n-type impurity concentration from increasing excessively at the portion overlapping between the first n-type offset-diffusion-region and the second n⁻-type offset-diffusion-region. Furthermore, according to the embodiment, the saturation current varies by modifying a distance variously between a LOCOS film and the second n⁻-type offset-diffusion-region. Then it is possible to adjust the saturation current by tuning the impurity concentration and a location (corresponding to a distance from the LOCOS film to the second n⁻-type offset-diffusion-region) thereof.

Based upon the above description, according to the embodiment, a depletion-type MOSFET having high saturation current can be realized while keeping high breakdown voltage realized by the first n-type offset-diffusion-region, along with promoting size reduction by the LOCOS techniques. Moreover, there is a lot of flexibility in adjusting the n-type impurity concentration of the first n-type offset-diffusion-region and the second n⁻-type offset-diffusion-region. Then the saturation current can be easily adjusted. Further, the saturation current (current capacity) can be adjusted by adjusting the distance between the LOCOS film and the second n⁻-type offset-diffusion-region without adjusting the n-type impurity concentration of the first n-type offset-diffusion-region and the second n⁻-type offset-diffusion-region and also without changing an element in size. Then circuit characteristics can be tuned easily.

According to the foregoing description, the present invention is changeable variously without the scope being not deviated from the gist thereof. For example, according to the embodiment described above, such as a dimension and impurity concentration in each of portions are variously set in response to specifications required and the like. Furthermore, according to the embodiment described above, the first conductivity type is assigned for n-type, and the second conductivity type for p-type. However, in the present invention, it is true that the first conductivity type is assigned for p-type, and the second conductivity type for n-type in a similar fashion.

As described above, the semiconductor device according to the present invention is useful for a power semiconductor device employed for an intelligent power switch (IPS) and the like in industrial and automotive application.

EXPLANATIONS OF REFERENCE NUMERALS

1: n-type semiconductor substrate
2: p-type well region
3: n⁺-type source region
4: p⁺-type contact region
5: n⁺-type drain region
6: First n-type offset-diffusion-region
7: LOCOS film
8: Gate dielectric film
9: Gate electrode
10: Semiconductor device (Depletion-type n-channel MOSFET)
11: Interlayer dielectric film
12: Source electrode
13, 15: Contact hole
14: Drain electrode
16: Second n⁻-type offset-diffusion-region
31: Enhancement-type n-channel MOSFET
32: Capacitor
GND: Ground terminal
IN: Input terminal
OUT: Output terminal
Vcc: Power supply terminal
x: Distance between LOCOS film 7 and second n⁻-type offset-diffusion-region 16

What is claimed is:
1. A semiconductor device, comprising:
a second conductive first semiconductor region disposed selectively on a surface layer of a first conductive semiconductor substrate;
a first conductive second semiconductor region disposed selectively inside the first semiconductor region;
a first conductive third semiconductor region disposed selectively so as to be separated from the second semiconductor region inside the first semiconductor region;
a first conductive fourth semiconductor region that is disposed so as to cover the third semiconductor region inside the first semiconductor region and extends over a part sandwiched between the second semiconductor region and the third semiconductor region to be in contact with the second semiconductor region in the first semiconductor region, wherein the first conductive fourth semiconductor region has lower impurity concentration than each of the second semiconductor region and the third semiconductor region;
a local dielectric film disposed selectively on the surface layer of the part sandwiched between the second semiconductor region and the third semiconductor region in the fourth semiconductor region;
a gate electrode disposed through a gate dielectric film on a surface of a part sandwiched between the local dielectric film and the second semiconductor region in the fourth semiconductor region;
a first conductive fifth semiconductor region disposed at a part located toward the second semiconductor region through the local dielectric film in the fourth semiconductor region to be in contact with the second semiconductor region, wherein the first conductive fifth semiconductor region has lower impurity concentration than the fourth semiconductor region;
a first electrode being in contact with the second semiconductor region; and a second electrode being in contact with the third semiconductor region.

2. The semiconductor device according to claim 1, wherein the fifth semiconductor region is placed so as to be separated from the local dielectric film.

3. The semiconductor device according to claim 1, wherein a plurality of semiconductor elements having the first semiconductor region, the second semiconductor region, the third semiconductor region, the fourth semiconductor region, the fifth semiconductor region, the local dielectric film, the gate dielectric film, and the gate electrode are disposed in the semiconductor substrate, wherein each of a plurality of the semiconductor elements has a different distance between the local dielectric film and the fifth semiconductor region.

4. The semiconductor device according to claim 1, wherein a depth in the fourth semiconductor region is shallower at one part sandwiched between the local dielectric film and the second semiconductor region than at another remaining part.

5. The semiconductor device according to claim 2, wherein a plurality of semiconductor elements having the first semiconductor region, the second semiconductor region, the third semiconductor region, the fourth semiconductor region, the fifth semiconductor region, the local dielectric film, the gate dielectric film, and the gate electrode are disposed in the semiconductor substrate, wherein each of a plurality of the semiconductor elements has a different distance between the local dielectric film and the fifth semiconductor region.

6. The semiconductor device according to claim 2, wherein a depth in the fourth semiconductor region is shallower at one part sandwiched between the local dielectric film and the second semiconductor region than at another remaining part.

7. The semiconductor device according to claim 3, wherein a depth in the fourth semiconductor region is shallower at one part sandwiched between the local dielectric film and the second semiconductor region than at another remaining part.

8. A semiconductor device, comprising:
a semiconductor substrate of a first conductivity type;
a well region of a second conductivity type on the semiconductor substrate;
a first diffusion region of the first conductivity type in the well region;
a drain region on a surface of the first diffusion region;
a dielectric film adjacent to the drain region; and
a second diffusion region of the first conductivity type in first diffusion region, separated from the dielectric film by a distance;
wherein a portion of the first diffusion region containing the second diffusion region is shallower than a portion of the first diffusion region below the dielectric film.

9. The semiconductor device of claim 8, wherein the second diffusion region is closer to a source electrode than to a drain electrode.

10. The semiconductor device of claim 9, wherein the second diffusion region has a lower impurity concentration than the first diffusion region.

11. The semiconductor region of claim 8, wherein the dielectric film is a local oxidation of silicon (LOCOS) film.

12. A semiconductor device, comprising:
a semiconductor substrate of a first conductivity type;
a well region of a second conductivity type on the semiconductor substrate;
a first diffusion region of the first conductivity type in the well region;
a drain region on a surface of the first diffusion region;
a dielectric film adjacent to the drain region; and
a second diffusion region of the first conductivity type in first diffusion region;
wherein the second diffusion region is closer to a source electrode than to a drain electrode.

* * * * *